United States Patent
Abiko

[11] Patent Number: 5,937,286
[45] Date of Patent: Aug. 10, 1999

[54] METHOD FOR MANUFACTURING SEMICONDUCTOR DEVICE

[75] Inventor: Hitoshi Abiko, Tokyo, Japan

[73] Assignee: NEC Corporation, Tokyo, Japan

[21] Appl. No.: 09/088,072

[22] Filed: Jun. 1, 1998

[30] Foreign Application Priority Data

May 30, 1997 [JP] Japan ..................... 9-141393

[51] Int. Cl.⁶ .............................. H01L 21/8238
[52] U.S. Cl. ................ 438/218; 438/221; 438/224
[58] Field of Search ................... 438/218, 227, 438/228, 401, 420, 451, 527, 942, 199, 700, 221, 224; 148/DIG. 43, DIG. 53, DIG. 100, DIG. 15.7, DIG. 82, DIG. 105

[56] References Cited

U.S. PATENT DOCUMENTS

| | | | |
|---|---|---|---|
| 4,876,214 | 10/1989 | Yamaguchi et al. | 438/426 |
| 5,449,367 | 9/1995 | Saito et al. | 438/227 |

FOREIGN PATENT DOCUMENTS

| | | |
|---|---|---|
| 60-226135 | 11/1985 | Japan . |
| 60-226136 | 11/1985 | Japan . |
| 1-232739 | 9/1989 | Japan . |

*Primary Examiner*—John F. Lattin
*Assistant Examiner*—Christopher Lattin
*Attorney, Agent, or Firm*—Young & Thompson

[57] ABSTRACT

To form a device isolating deep trench adjacent to a well, the deep trench is formed by using, as a mask, a photoresist mask used for forming the well and a silicon oxide film or a polysilicon film formed on a semiconductor substrate and patterned by an etching using another photoresist mask which was used for forming an adjacent well, or two patterned insulating layers formed on the semiconductor substrate. Thus, the deep trench for the device isolation can be formed without adding a photoresist step for forming a trench formation pattern. In addition, since a lift-off process is not used for forming the deep trench, an isolation trench having a narrow width can be formed, and also, there does not occur the re-deposition of the peeled-off plasma CVD insulating film onto the semiconductor substrate, with the result that the stability in manufacturing the semiconductor device is remarkably elevated.

18 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more specifically to a method for manufacturing a semiconductor device such as a MOSFET integrated circuit having trenches having different depths.

2. Description of Related Art

With recent increase in the integration density of a semiconductor integrated circuit, further microminiaturization of circuit elements is demanded. In addition, with the microminiaturization of circuit elements, nicrominiaturization of a device isolation region is demanded and has become an important problem.

In the prior art semiconductor integrated circuit, it was a general practice to realize an inter-device electric isolation by selectively oxidizing a silicon semiconductor substrate by a LOCOS (local oxidation of silicon) process. However, when the device isolation is conducted by the LOCOS, a so-called "bird's beak" is formed in the proximity of the device isolation region in the process of manufacturing the semiconductor integrated circuit, and in order to prevent a latch-up phenomenon in a well isolation region, it was necessary to form the well isolation region having the width on the order of 7 $\mu$m to 8 $\mu$m to surround the well. However, these have become a structural cause for obstructing the increase of the integration density in the semiconductor integrated circuit Under the above mentioned circumstance, it was proposed to electrically isolate between devices by forming a groove, called a "trench", and by filling up the trench with an insulating material. In this case, in order to make a well isolating region (isolation width) small, a relatively narrow and deep trench and a relative wide and shallow trench are used in combination.

Japanese Patent Application Pre-examination Publication No. JP-A-60-226126 and No. JP-A-01-232739 propose semiconductor device manufacturing methods using a device isolation technology utilizing the trench. In these methods, each device is isolated by forming trenches having different depths. In addition, it is necessary to carry out a different photoresist process for each trench having a different depth. Incidentally, an English abstract of each of JP-A-60-226126 and No. JP-A-01-232739 is available from the Japanese Patent Office and the content of each English abstract is also incorporated by reference in its entirety into this application.

First, the process disclosed by JP-A-60-226126 will be described. After a mask pattern for forming a shallow trench is formed, a photoresist is formed to cover a deep trench formation region and then patterned, and a mask layer is etched by using the patterned photoresist as a mask to form a deep trench, and thereafter, a further etching is conducted by using the mask pattern for forming the shallow trench, so as to form a shallow trench.

However, the following problems has been encountered in the above mentioned method for manufacturing the semiconductor device. Namely, the prior art method typified by the process disclosed by JP-A-60-226126 requires two photoresist processes, namely, a photoresist process for forming the shallow trench and a photoresist process for forming the deep trench. Increase of the number of photoresist processes results in increase of the number of photoresist removing processes, resulting in an increased cost for manufacturing the semiconductor device.

Japanese Patent Application Pre-examination Publication No. JP-A-60-226135 (an English abstract of JP-A-60-226135 is available from the Japanese Patent Office and the content of the English abstract of JP-A-60-226135 is incorporated by reference in its entirety into this application) proposed a semiconductor device manufacturing method capable of simplifying the process for forming the trench for the device isolation. In this proposed method, a pattern for forming a deep trench used for a well isolation, is automatically generated in a self-alignment with a well pattern. According to this proposed method, a gap is formed in a self alignment at an end of the mask pattern used for a well implantation, by a lift-off process, and then, an etching is carried out to form a trench. Thus, the deep trench used for the well isolation can be formed without increasing the number of photoresist steps.

However, even if the method disclosed by JP-A-60-226135 is used, the microfabrication of the device cannot be realized, and stability in manufacturing of the semiconductor integrated circuit device is obstructed. In brief, in this proposed method, a mask used for forming the trench having a sufficient depth to penetrate through the well in order to isolate the well, is formed by lifting off a plasma CVD insulating film on a first mask formed on a first well, by utilizing the phenomenon that a side wall of the plasma CVD insulating film is preferentially etched. However, if the spacing between the first masks becomes small because of reduction of the device size caused by the increased integration density of the semiconductor integrated circuit device, the plasma CVD insulating film no longer enters into the gaps between the first masks, with the result that a mask used for forming a trench in a second well by an etching cannot be formed.

A second problem is that, when the plasma CVD insulating film is lifted off, the peeled-off plasma CVD film is deposited again on the semiconductor substrate, disrupting the stability in manufacturing of the semiconductor integrated circuit device.

SUMMARY OF THE INVENTION

Accordingly, it is an object of the present invention to provide a semiconductor device forming method which has overcome the above mentioned defect of the conventional ones.

Another object of the present invention is to provide a semiconductor device forming method, capable of forming a trench for a device isolation, without increasing the number of photoresist steps.

Still another object of the present invention is to provide a semiconductor device forming method, capable of stably forming a trench for a device isolation, even in a reduced device size, without increasing the number of photoresist steps, and without obstructing the stability in manufacturing of the semiconductor integrated circuit device.

The above and other objects of the present invention are achieved in accordance with the present invention by a method for manufacturing a semiconductor device, including the steps of forming a well in a semiconductor substrate by using a first photoresist pattern as a mask, and patterning an insulating film formed on the semiconductor substrate, by using the first photoresist pattern as a mask, and forming a trench in the semiconductor substrate by using as a mask the patterned insulating film and a second photoresist pattern formed separately from the patterned insulating film.

According to another aspect of the present invention, there is provided a method for manufacturing a semiconductor device, including the steps of forming a first insulating film on a semiconductor substrate, patterned by using a first photoresist pattern used for forming a first well, forming a second insulating film on the semiconductor substrate, patterned by using a second photoresist pattern used for formitng a second well near to the first well, and forming a trench in the semiconductor substrate by using the first and second insulating films as a mask.

As seen from the above, in the semiconductor device forming method in accordance with the present invention, a trench structure is formed for a well isolation or a device isolation. The trench is formed in self-alignment with a well pattern, without using the lift-off technology as in the prior art disclosed by the JP-A-60-226135. As mentioned hereinbefore, in the general prior art semiconductor device forming method, when a deep trench and a shallow trench are formed in the semiconductor device, it was required to carry out a plurality of photoresist steps while performing an alignment for formation of each trench. In the present invention, on the other hand, when a device isolating trench is to be formed in proximity of a well, the trench is formed by using, as a mask, a photoresist used for a well formation, and a silicon-based film such as a silicon oxide film and a polysilicon film which are formed on a silicon semiconductor substrate and patterned by an etching using the photoresist used for the well formation. Therefore, it is no longer necessary to add a photoresist step for the purpose of forming the device isolating trench, and therefore, it is no longer necessary to perform an alignment for patterning a photoresist for formation of the device isolating trench. Furthermore, since the number of photoresist steps is not increased, the manufacturing cost can be suppressed.

In the semiconductor device forming method in accordance with the present invention, moreover, even if the device size is small and therefore the spacing between the masks is correspondingly small, the trench can be surely formed. In addition, since the lift-off is not carried out, there occurs no problem in which the peeled-off plasma CVD insulating film is deposited on the semiconductor substrate again.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the semiconductor device forming method in accordance with the present invention will be described with reference to the accompanying drawings.

First Embodiment

A first embodiment of the semiconductor device forming method in accordance with the present invention will be described with reference to FIGS. 1A to 1H.

Figure 1A:
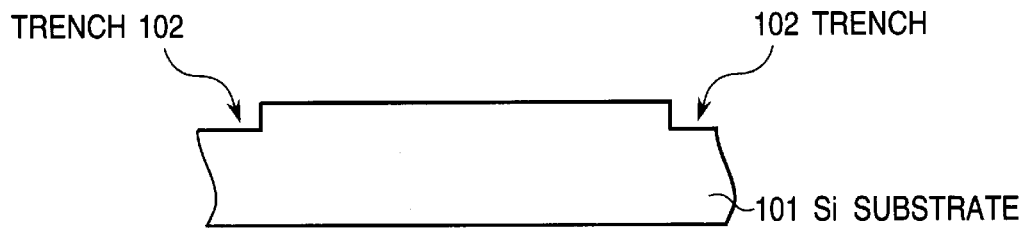
FIGS. 1A to 1H are diagrammatic sectional view of a semiconductor device, for illustrating a first embodiment of the semiconductor device forming method in accordance with the present invention.

First, as shown in FIG. 1A, trenches 102 having the depth of 300 nm are formed in a principal surface of a substrate 101 formed of a single crystalline silicon of a first conductivity type. In FIG. 1A and all the succeeding figures, only a device isolation region confined by forming a trench and its neighboring region are shown, and opposite ends of the substrate 101 are omitted for simplification of the drawing.

Figure 1B:
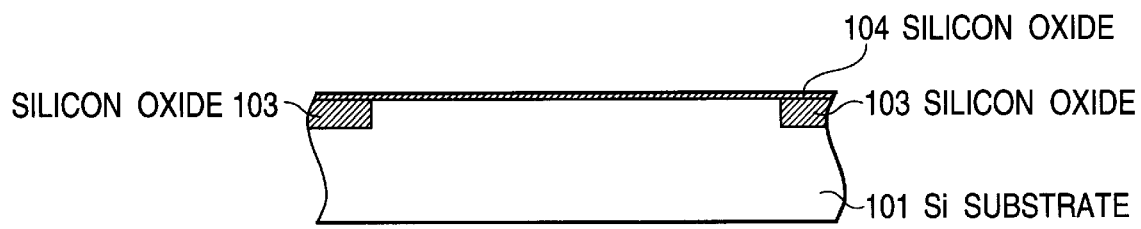

Then, as shown in FIG. 1B, a silicon oxide 103 is filled into the trenches 102, and a silicon oxide layer 104 having the thickness of 10 nm is formed to cover the filling silicon oxide 103 and the principal surface of the substrate 101. For example, the trenches 102 are filled up by depositing a silicon oxide by means of a CVD (chemical vapor deposition) process and then planarizing the deposited silicon oxide by a CMP (chemical mechanical polishing) process.

Figure 1C:
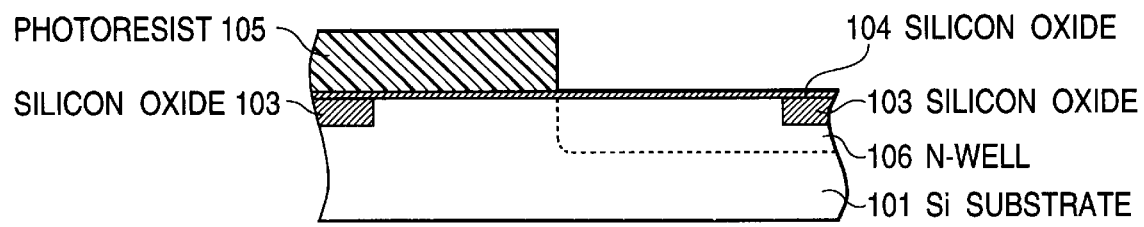

Thereafter, as shown in FIG. 1C, a patterned photoresist 105 is formed to cover only a P-well forming region which is to be formed in a later step. Furthermore, a donor such as phosphorus is ion-implanted at a dose of $5 \times 10^{15}$ cm$^{-2}$ under 1000 keV, at a dose of $5 \times 10^{15}$ cm$^{-2}$ under 500 keV, and then, at a dose of $5 \times 10^{15}$ cm$^{-2}$ under 100 keV, to form an N-well 106. Within this N-well 106, a pMOSFET will be formed in a later step (not shown).

Figure 1D:
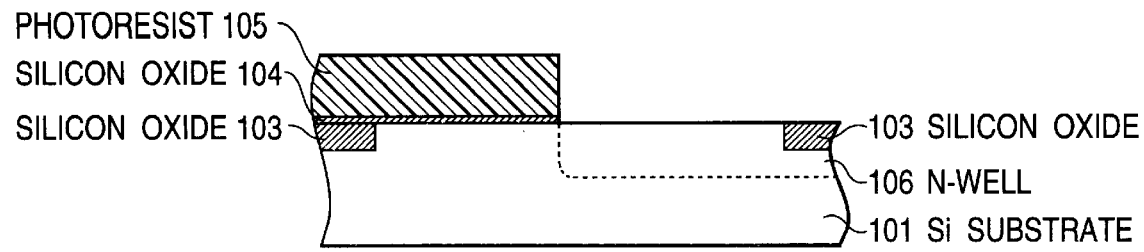

Then, as shown in FIG. 1D, the exposed silicon oxide film 104 on the N-well 106 is removed by a selective etching using fluorine, using the photoresist 105 as a mask.

Figure 1E:
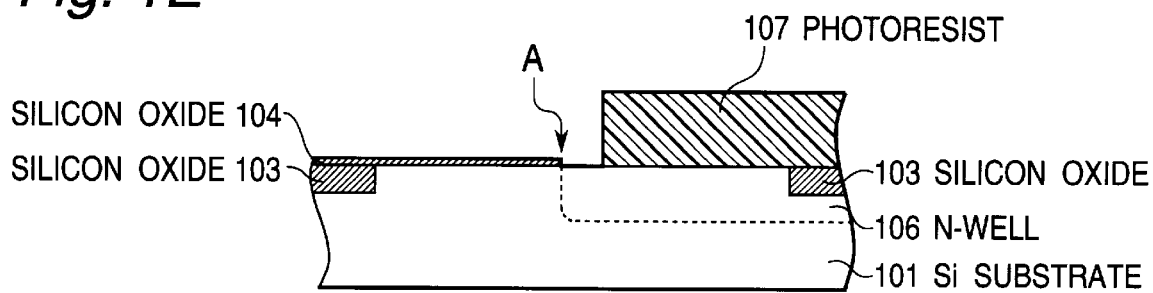

Thereafter, as shown in FIG. 1E, after the photoresist 105 is removed, another photoresist 107 is formed to cover a portion of the N-well 106. This photoresist 107 is formed in such a manner that an end of the photoresist 107 is separated from an end "A" of the N-well 106 by a predetermined distance (for example, on the order of 0.5 $\mu$m). This predetermined distance will determine the width of a trench which will be formed in a later step.

Figure 1F:
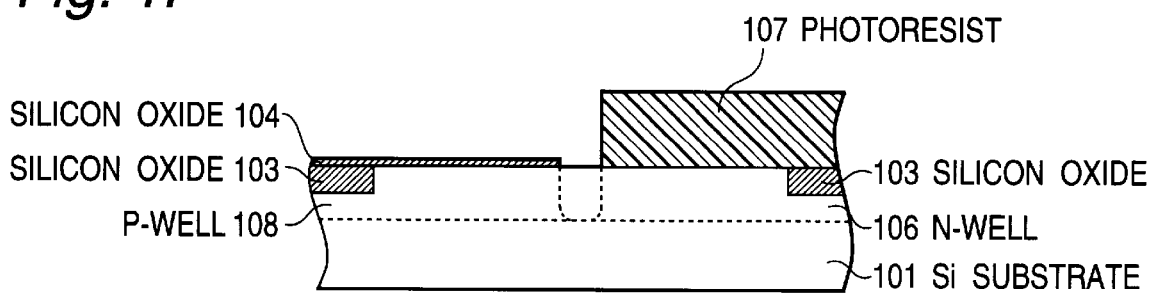

Then, as shown in FIG. 1F, a P-well 108 is formed by an ion implantation. For example, to form the P-well 108, an acceptor such as boron is ion-implanted at a dose of $5 \times 10^{15}$ cm$^{-2}$ under 500 keV, and then at a dose of $5 \times 10^{15}$ cm$^{-2}$ under 250 keV. Within this P-well 108, an nMOSFET will be formed in a later step (not shown).

Figure 1G:
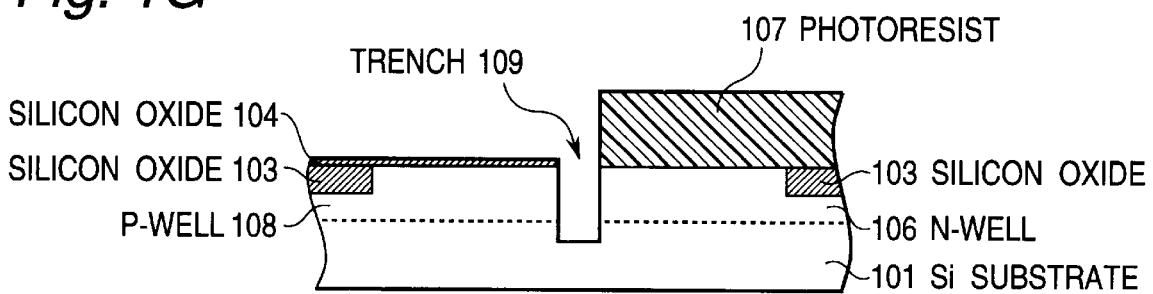

Thereafter, as shown in FIG. 1G, the substrate 101 is etched using the photoresist 107 and the remaining silicon oxide film 104 as a mask, to form a trench 109 having the depth of about 500 nm, which is larger than that of the firstly formed trench 102.

Figure 1H:
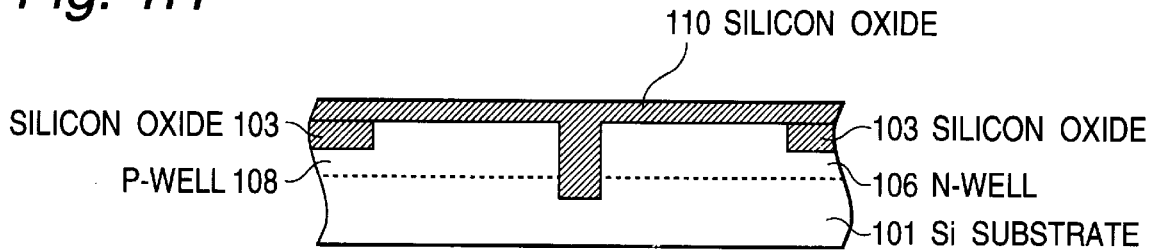

Then, the photoresist 107 is removed, and as shown in FIG. 1H, an insulating material such as a silicon oxide 110 is filled into the deep trench 109. Thus, the semiconductor device having the shallow trench 102 and the deep trench 109 is formed.

Second Embodiment

In the first embodiment, the photoresist 107 is formed directly on an exposed region of the substrate 101 in the step shown in FIG. 1E. In the process including the step exposing the substrate surface to the photoresist, such as the step shown in FIG. 1E, there is a fear that the substrate 101 may be contaminated with an impurity. Now, a method for forming a trench without exposing the substrate surface directly to the photoresist will be described as a second embodiment.

The second embodiment of the semiconductor device forming method in accordance with the present invention will be described with reference to FIGS. 2A to 2E.

Figure 2A:
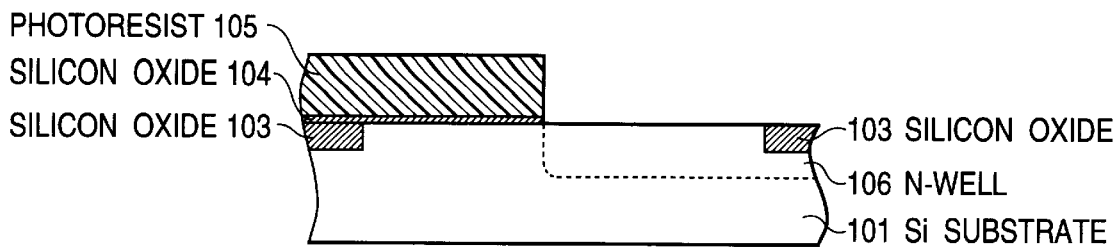
FIGS. 2A to 2E are diagrammatic sectional view of a semiconductor device, for illustrating a second embodiment of the semiconductor device forming method in accordance with the present invention.

As shown in FIG. 2A, the N-well 106 is formed in the substrate 101 and the silicon oxide film 104 on the N-well 106 is selectively removed, similarly to the steps of the first embodiment until the step shown in FIG. 1D.

Figure 2B:
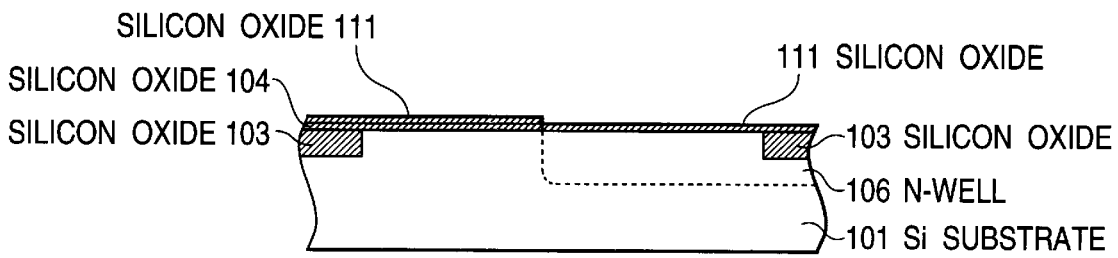

After the photoresist 105 is removed, a silicon oxide film 111 having the thickness of 10 nm is formed by a thermal oxidation to cover the whole surface as shown in FIG. 2B. As a result, the surface of the P-well forming region is covered with a silicon oxide film having a thickness of about 20 nm, which is composed of the silicon oxide films 104 and 111.

Figure 2C:
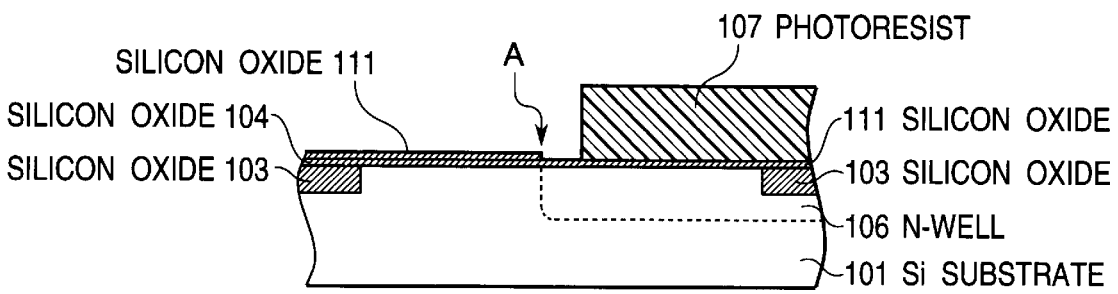

Then, as shown in FIG. 2C, another photoresist 107 is formed to cover a portion of the N-well 106 in such a manner that an end of the photoresist 107 is separated from an end "A" of the N-well 106 by a predetermined distance corresponding to the width of a trench which will be formed in a later step.

Figure 2D:
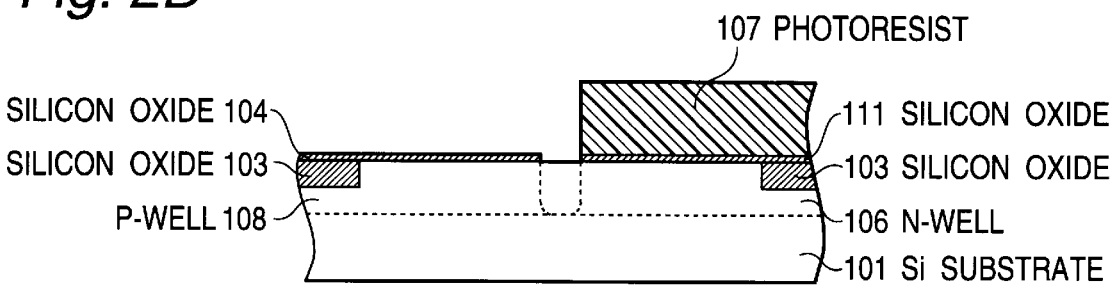

Thereafter, as shown in FIG. 2D, a P-well 108 is formed by ion-implanting an acceptor such as boron, similarly to the first embodiment, and then, the silicon oxide film 111 is selectively removed by fluorine, using the photoresist 107 as a mask, so that an exposed region of the substrate 101 is formed between the end "A" of the N-well 106 and the end of the photoresist 107.

Figure 2E:
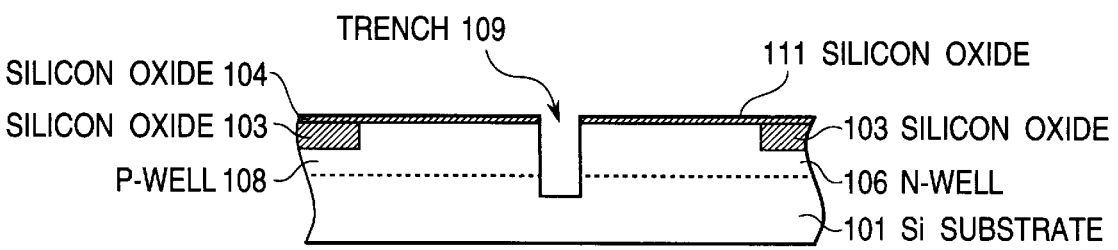

Then, as shown in FIG. 2E, the substrate 101 is etched using the photoresist 107 and the remaining silicon oxide film 104 as a mask, to form a deep trench 109, similarly to the first embodiment. Further, the photoresist 107 is removed, and an insulating material is filled into the deep trench 109, also similarly to the first embodiment.

Third Embodiment

In the first and second embodiments, only the deep trench 109 is formed in the device isolation region. As a third embodiment, a method for forming a plurality of trenches having different depths in the isolation region will be described with reference to FIGS. 3A to 3H.

Figure 3A:
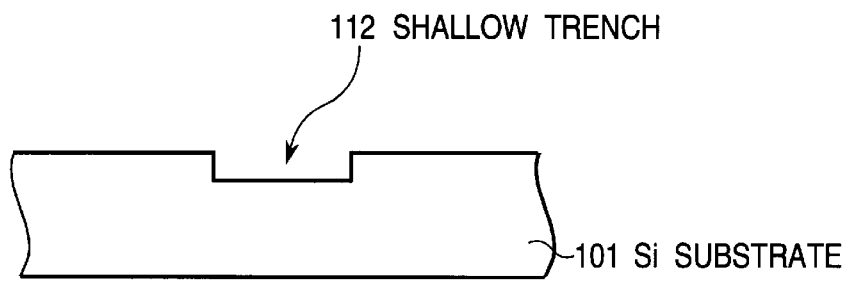
FIGS. 3A to 3J are diagrammatic sectional view of a semiconductor device, for illustrating a third embodiment of the semiconductor device forming method in accordance with the present invention.

First, as shown in FIG. 3A, a shallow trench 112 is formed in a principal surface of a substrate 101 formed of a single crystalline silicon.

Figure 3B:
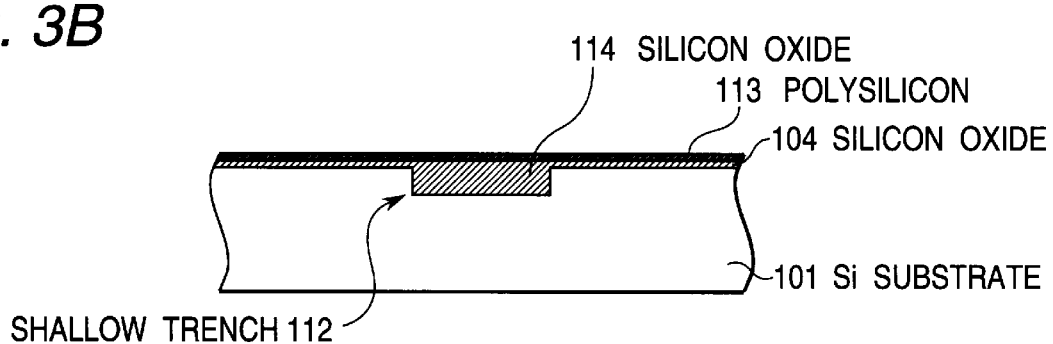

Then as shown in FIG. 3B, a silicon oxide layer 104 having the thickness of 10nm is formed to cover the whole surface while filling up the shallow trench 112 with a silicon oxide 114. This can be realized by depositing a silicon oxide by a CVD process and then by planarizing the deposited silicon oxide by a CMP process. Furthermore, a polysilicon film 113 is formed on a surface of the silicon oxide film 104.

Figure 3C:
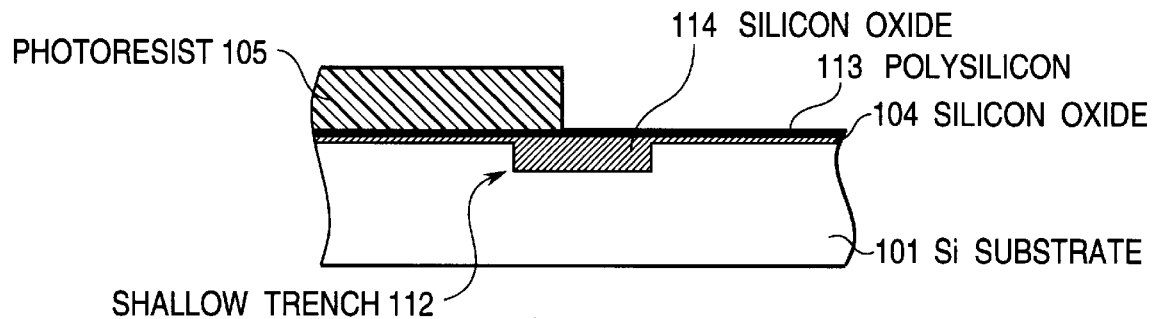

Thereafter, as shown in FIG. 3C, a patterned photoresist 105 is formed on the polysilicon film 113 to cover only a P-well forming region which is to be formed in a later step, and in such a manner that the photoresist 105 partially covers the silicon oxide 114 filled up into the shallow trench 112.

Figure 3D:
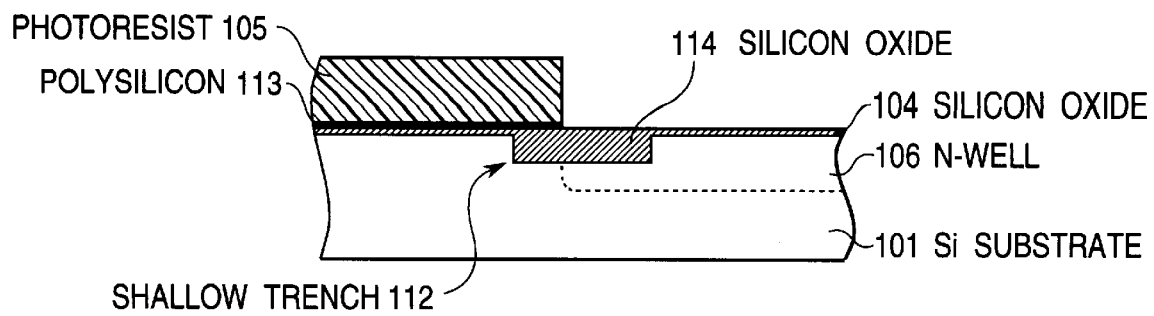

Then, the polysilicon film 113 is selectively removed by an etching using the photoresist 105 as a mask, and as shown in FIG. 3D, the N-well 106 is formed, similarly to the process described in connection with the first embodiment.

Figure 3E:
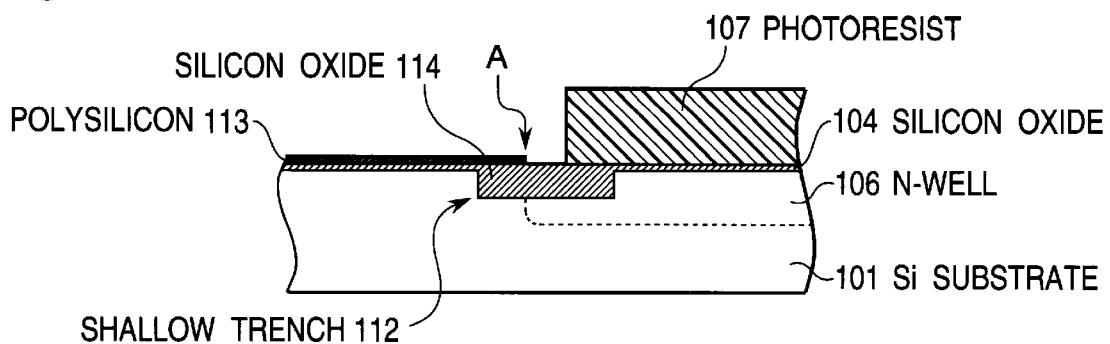

Further, after the photoresist 105 is removed, as shown, in FIG. 3E, another photoresist 107 is formed to cover a portion of the N-well 106 in such a manner that an end of the photoresist 107 is separated from an end "A" of the N-well 106 by a predetermined distance corresponding to the width of a deep trench which will be formed in a later step, so that a spacing between the end "A" of the N-well 106 and the above mentioned end of the photoresist 107 is positioned at a center of the shallow trench 112.

Figure 3F:
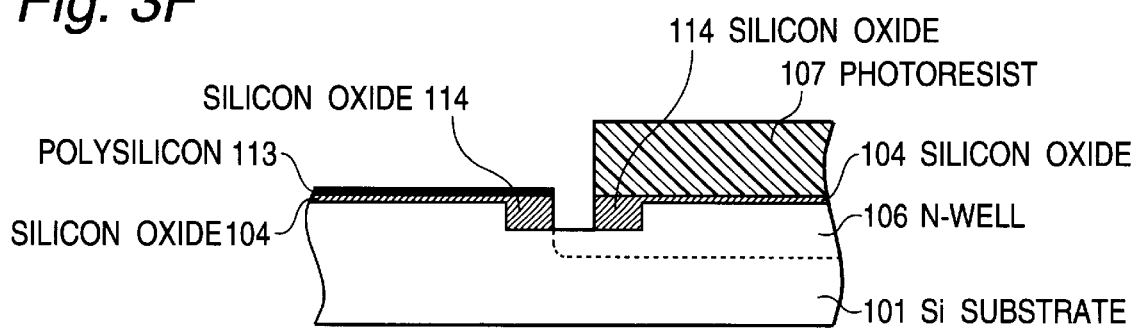

Then, as shown in FIG. 3F, the silicon oxide film 104 and the silicon oxide 114 filling up the shallow trench 112 is selectively removed by an etching using the remaining polysilicon layer 113 and the photoresist 107 as a mask, so that the silicon substrate is exposed at the center of the shallow trench 112.

Figure 3G:
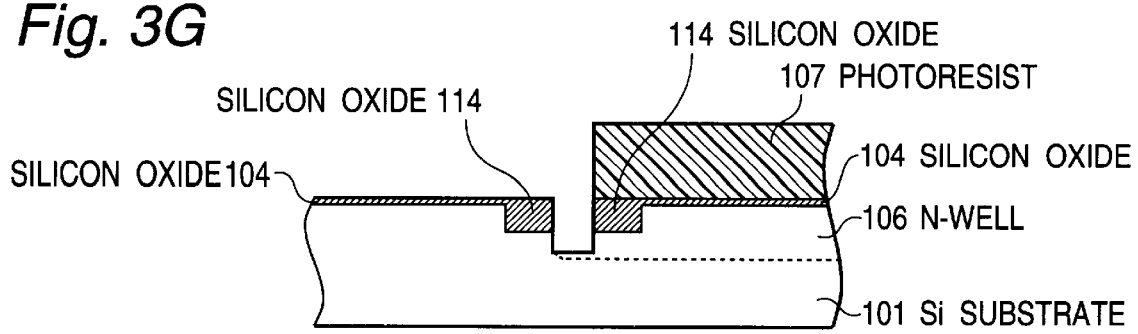

Thereafter, as shown in FIG. 3G, the remaining polysilicon layer 113 is removed by an etching, and at the same time, the silicon substrate 101 is further etched by a depth on the order of 10 nm at a position where the silicon substrate is exposed at the center of the shallow trench 112.

Figure 3H:
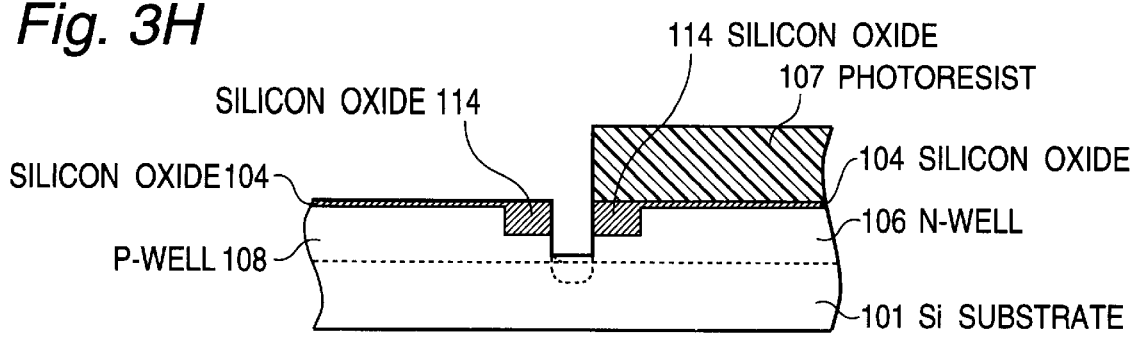

As shown in FIG. 3H, a P-well 108 is formed, similarly to the first embodiment.

Figure 3I:
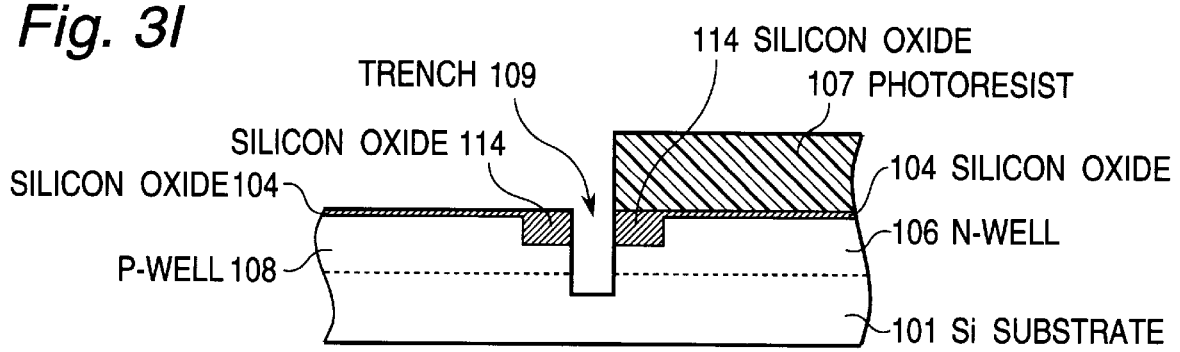

Then, as shown in FIG. 3I, the substrate 101 is further etched using the photoresist 107 and the exposed silicon oxide film 104 as a mask, to form a deep trench 109 which is deeper than the depth of the N-well 106 and the P-well 108.

Figure 3J:
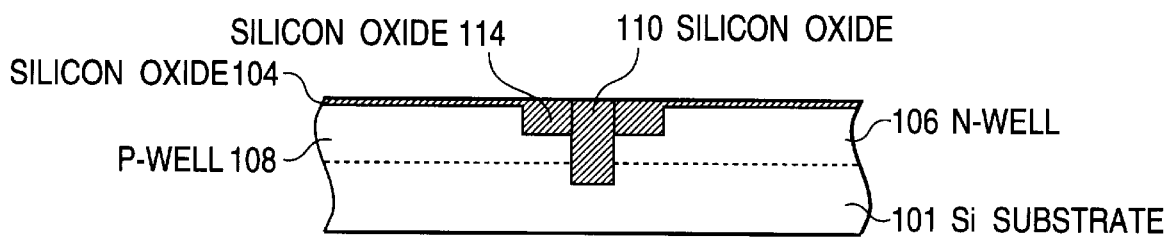

Finally, the photoresist 107 is removed, and as shown in FIG. 3J, an insulating material such as a silicon oxide 110 is filled into the deep trench 109. Thus, the semiconductor device can be obtained which has the well isolation region in which the deep trench 109 is formed and a pair of shallow trenches are formed at opposite sides of the deep trench 109, and these trenches 109 and 112 are filled up with the silicon oxides 110 and 114.

Fourth Embodiment

As a fourth embodiment, another method for forming a plurality of trenches having different depths in the device isolation region will be described with reference to FIGS. 4A to 4H.

Figure 4A:
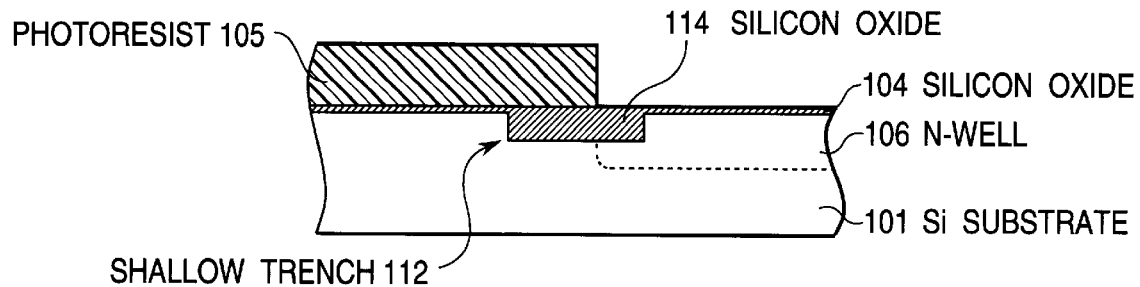
FIGS. 4A to 4H are diagrammatic sectional view of a semiconductor device, for illustrating a fourth embodiment of the semiconductor device forming method in accordance with the present invention.

As shown in FIG. 4A, a shallow trench 112 is formed in a principal surface of the substrate 101, and a silicon oxide film 104 having the thickness of 10 nm is formed on the principal surface of the substrate 101, while filling up the shallow trench 112 with a silicon oxide 114. A patterned photoresist 105 is formed to partially cover the silicon oxide film 104 in such a manner that patterned photoresist 105 covers a more-than-half portion of a surface of the silicon oxide 114 filling up the shallow trench 112, including a center of the silicon oxide 114 filling up the shallow trench 112. Similarly to the first embodiment, an N-well 106 is formed by an ion implantation using the photoresist 105 as a mask.

Figure 4B:
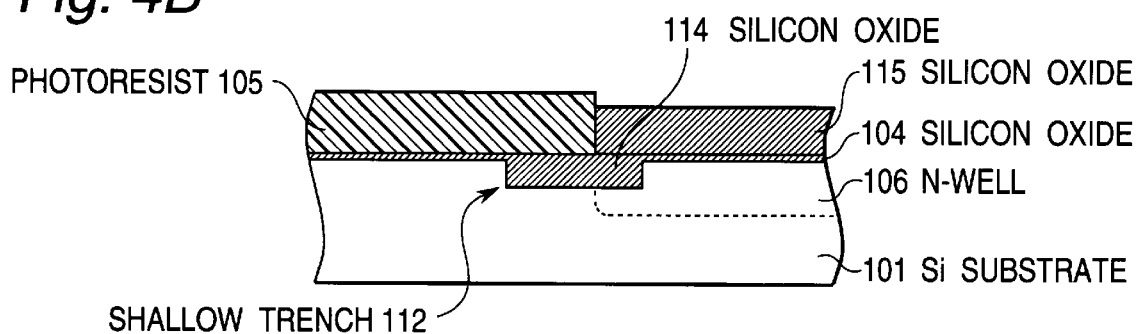

As shown in FIG. 4B, a silicon oxide film 115 having a thickness larger than the thickness from the surface of the silicon oxide film 104 to the bottom of the shallow trench 112, is selectively formed only on the N-well region 106. The silicon oxide film 115 can be selectively formed on the region excluding the photoresist 105, by for example, immersing the substrate 101 into an aqueous solution of hydrosilicofluoric acid (H2SiF6), and causing a boric acid (H3BO3) aqueous solution to fall in drops into the aqueous solution of hydrosilicofluoric acid.

Figure 4C:
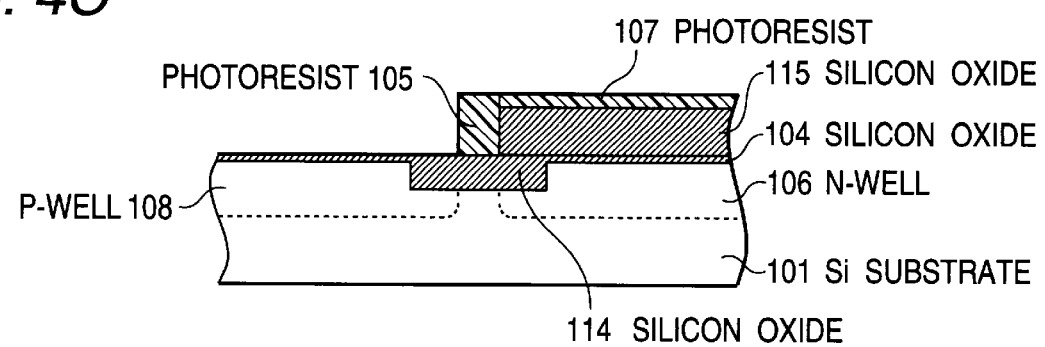

Thereafter, as shown in FIG. 4C, the photoresist 105 on the P-well forming region is selectively removed, and another photoresist 107 is formed on the silicon oxide film 115. In addition, a P-well 108 is formed, similarly to the process of the first embodiment.

Figure 4D:
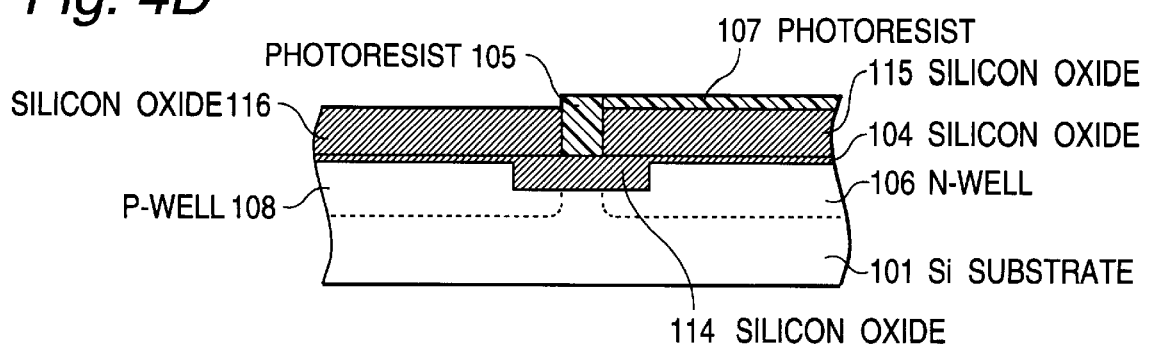

As shown in FIG. 4D, a silicon oxide film 116 having a thickness equal to that of the silicon oxide film 115, is selectively formed only on the silicon oxide film 104 under which the P-well region 108 is formed.

Figure 4E:
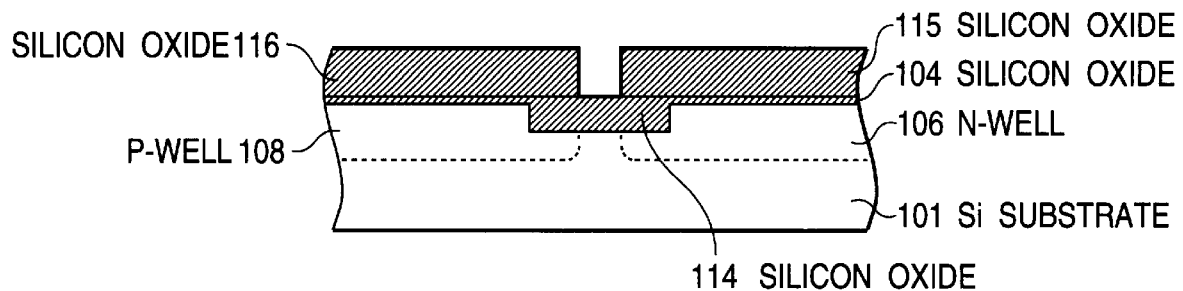

Then, as shown in FIG. 4E, the photoresists 105 and 107 are removed.

Figure 4F:
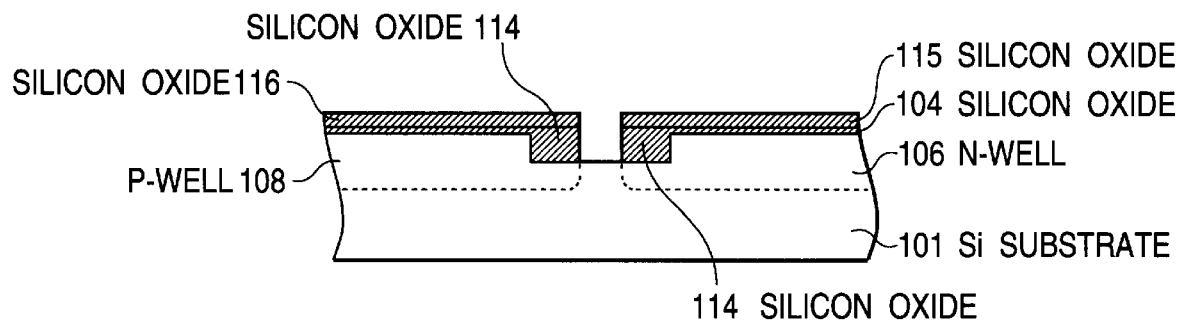

Furthermore, an etching is carried out until the silicon oxide film 114 filling up the shallow trench 112 is removed and the bottom of the shallow trench 112 is exposed, as shown in FIG. 4F.

Figure 4G:
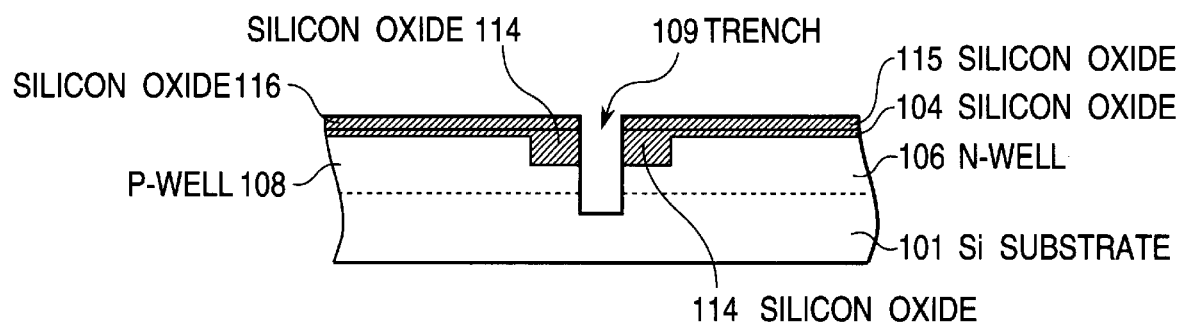

Thereafter, as shown in FIG. 4G, the substrate 101 is etched using the remaining silicon oxide films 115 and 116 as a mask, to form a deep trench 109 which is deeper than the depth of the N-well 106 and the P-well 108.

Figure 4H:
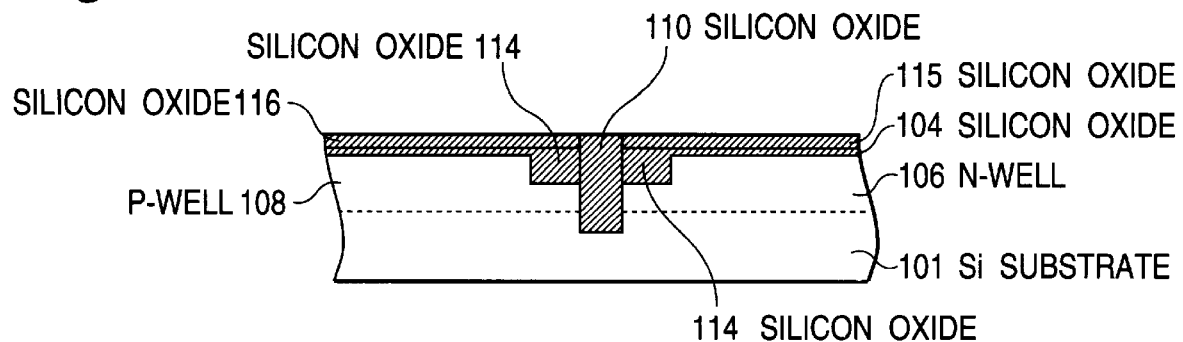

Then, as shown in FIG. 4H, an insulating material such as a silicon oxide 110 is filled into the deep trench 109. Thus, the semiconductor device can be obtained which has the well isolation region in which the deep trench 109 is formed and a pair of shallow trenches are formed at opposite sides of the deep trench 109, and these trenches 109 and 112 are filled up with the silicon oxides 110 and 114.

Fifth Embodiment

As a process for filling up the deep trench with an insulating material in the first to fourth embodiments, can include the step of depositing an insulating material by a CVD process and the step of removing the deposited insulating material to the substrate surface by means of the CMP process. Now, a method for elevating the polishing precision of the CMP process will be described with reference to FIGS. 5A to 5E.

Figure 5A:
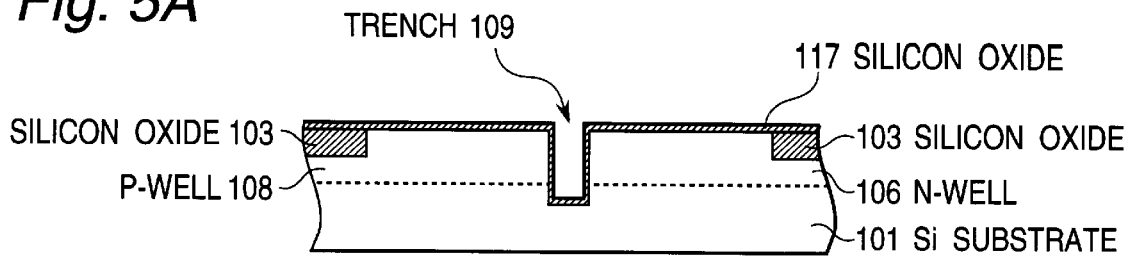
FIGS. 5A to 5E are diagrammatic sectional view of a semiconductor device, for illustrating a fifth embodiment of the semiconductor device forming method in accordance with the present invention.

First, as shown in FIG. 5A, a silicon oxide film 117 having the thickness of 10 nm is formed on an inner wall surface of the trench 109 and the surface of the substrate 101 (N-well 106 and P-well 108).

Figure 5B:
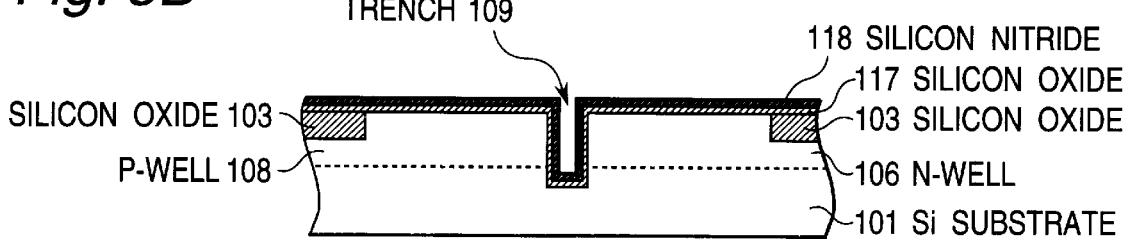

Then, as shown in FIG. 5B, a silicon nitride film 118 is formed on the surface of the silicon oxide film 117.

Figure 5C:
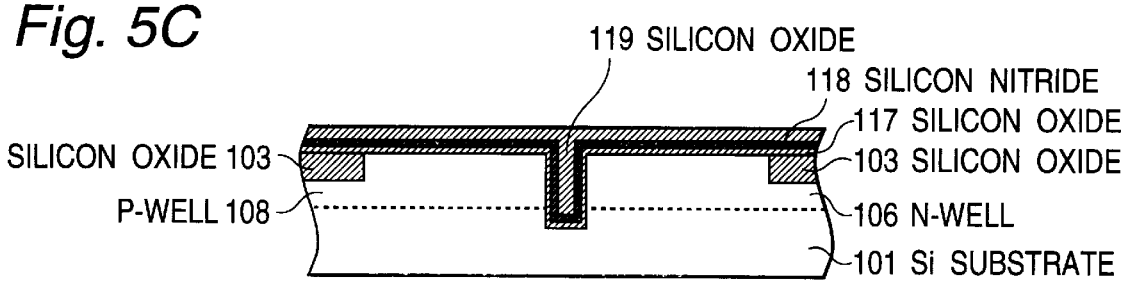

Furthermore, as shown in FIG. 5C, a silicon oxide film 119 is deposited on the silicon nitride film 118 by the CVD process to completely fill up the deep trench 109.

Figure 5D:
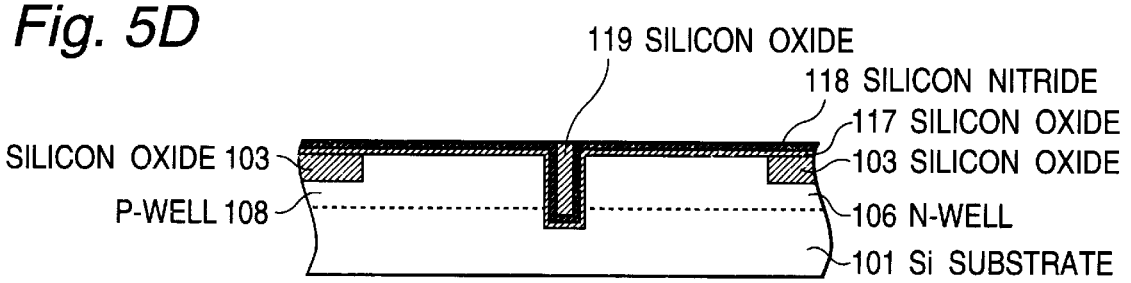

Thereafter, as shown in FIG. 5D, the silicon oxide film 119 is polished by the CMP process. In the CMP process, since the polishing of the silicon nitride 118 is more difficult than the polishing of the silicon oxide film, if the polishing reaches the silicon nitride film 118, the polishing speed drops. Therefore, at this time where the polishing reaches the silicon nitride film 118, the CMP process is stopped. Thus, the silicon oxide film 119 on the substrate surface can be surely removed with a high degree of polishing precision.

Figure 5E:
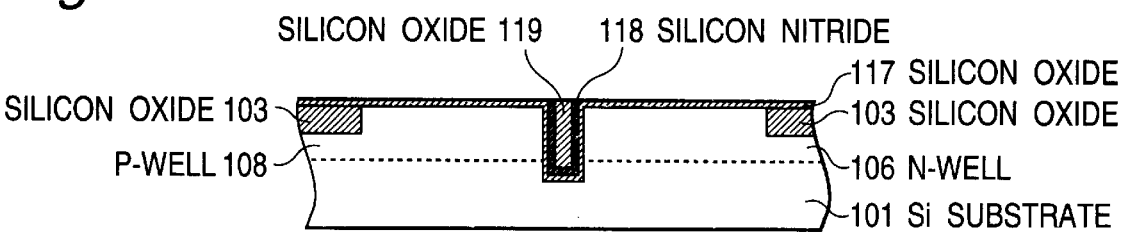

Finally, the exposed silicon nitride film 118 is removed by a heated phosphoric acid Thus, the deep trench filled up with the insulating material is formed as shown in FIG. 5E.

As seen from the above, the semiconductor device forming method in accordance with the present invention has the following advantages: Namely, since the pattern for forming a deep trench for the well isolation is automatically set from the positional relation between one well and a mask for forming another well, it is no longer necessary to add a photoresist step for forming a trench formation pattern. In addition, since the lift-off process used in the prior art is not used in the semiconductor device forming method in accordance with the present invention, it is possible to form an isolation trench having a narrow width, and also, there does not occur the re-deposition of the peeled-off plasma CVD insulating film onto the semiconductor substrate, with the result that the stability in manufacturing the semiconductor device is remarkably elevated.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a semiconductor device, including the steps of forming a well in a semiconductor substrate by using a first photoresist pattern as a mask, and patterning an insulating film formed on said semiconductor substrate, by using said first photoresist pattern as a mask, and forming a trench in said semiconductor substrate by using as a mask the patterned insulating film and a second photoresist pattern spaced from said patterned insulating film.

2. The method of claim 1, wherein the second photoresist pattern is spaced from the patterned insulating film by a distance that defines a dimension of the trench.

3. A method claimed in claim 2, wherein said patterned insulating film is formed by forming a first insulating film to cover a first region, a second region, and a third region between said first and second regions, of a principal surface of said semiconductor substrate, forming said first photoresist pattern on said first region of said principal surface of said semiconductor substrate, and selectively removing said first insulating film by using said first photoresist pattern as a mask, so that said patterned insulating film is formed to cover only said first region of said principal surface of said semiconductor substrate, and wherein after said first photoresist pattern is removed, said second photoresist pattern is formed to cover only said second region of said principal surface of said semiconductor substrate, and said third region of said principal surface of said semiconductor substrate is selectively etched to form said trench by using said second photoresist pattern and said patterned insulating film as a mask.

4. A method claimed in claim 3,
wherein said semiconductor substrate is formed of a single crystalline silicon substrate and a pair of second trenches are formed separately from each other on a principal surface of said single crystalline silicon substrate, so that said first, second and third regions are included between said pair of second trenches, and said pair of second trenches are filled with a first insulating material,
wherein said first insulating film is formed of a first thin silicon oxide film deposited on said first insulating material filling up said second trenches and said principal surface of said single crystalline silicon substrate,
wherein said first photoresist pattern is formed on said first insulating film in said first region of said principal surface of said single crystalline silicon substrate,
wherein said first named well is formed by ion-implanting a first impurity into said second and third regions of said principal surface of said single crystalline silicon substrate by using said first photoresist pattern as a mask,
wherein said patterned insulating film is formed by selective etching said first insulating film by using said first photoresist pattern as a mask, wherein after said first photoresist pattern is removed, said second photoresist pattern is formed on said second region of said principal surface of said single crystalline silicon substrate, wherein a second well is formed by ion-implanting a second impurity into said first and third regions of said principal surface of said single crystalline silicon substrate by using said second photoresist pattern as a mask, wherein said first named trench is formed by selectively etching said third region of said principal surface of said single crystalline silicon substrate by using said patterned insulating film and said second photoresist pattern as a mask, so that said first named trench has a depth larger than that of said second trenches, and wherein after said second photoresist pattern is removed, a second insulating material is filled into said first named trench.

5. A method claimed in claim 3, wherein said semiconductor substrate is formed of a single crystalline silicon substrate and a pair of second trenches are formed separately from each other on a principal surface of said single crystalline silicon substrate, so that said first, second and third regions are included between said pair of second trenches, and said pair of second trenches are filled with a first insulating material, wherein said first insulating film is formed of a first thin silicon oxide film deposited on said first insulating material filling up said second trenches and said principal surface of said single crystalline silicon substrate, wherein said first photoresist pattern is formed on said first insulating film in said first region of said principal surface of said single crystalline silicon substrate, wherein said first named well is formed by ion-implanting a first impurity into said second and third regions of said principal surface of said single crystalline silicon substrate by using said first photoresist pattern as a mask, wherein said first thin silicon oxide film on said second and third regions of said principal surface of said single crystalline silicon substrate is selectively removed, and said first photoresist pattern is removed, wherein a second thin silicon oxide film is formed on said thin silicon oxide film remaining in said first region of said principal surface of said single crystalline silicon substrate and on exposed second and third regions of said principal surface of said single crystalline silicon substrate, wherein said second photoresist pattern is formed on said second thin silicon oxide film on said second region of said principal surface of said single crystalline silicon substrate, wherein a second well is formed by ion-implanting a second impurity into said first and third regions of said principal surface of said single crystalline silicon substrate by using said second photoresist pattern as a mask, wherein said second thin silicon oxide film formed on said first and third regions of said principal surface of said single crystalline silicon substrate, but not is covered said second photoresist pattern, and said second photoresist pattern are removed, and said first named trench is formed by selectively etching said third region of said principal surface of said single crystalline silicon substrate by using as a mask said first thin silicon oxide film remaining on said first region of said principal surface of said single crystalline silicon substrate, and said second thin silicon oxide film remaining on said second region of said principal surface of said single crystalline silicon substrate, so that said first named trench has a depth larger than that of said second trenches, and wherein after said second photoresist pattern is removed, a second insulating material is filled into said first named trench.

6. A method claimed in claim 3, wherein said semiconductor substrate is formed of a single crystalline silicon substrate and a second trench is formed on a principal surface of said single crystalline silicon substrate, at a region including a position corresponding to said third region, and said second trench is filled with a first insulating material, wherein said first insulating film is formed of a first thin silicon oxide film deposited on said first insulating material filling up said second trench and said principal surface of said single crystalline silicon substrate, and a polysilicon film is formed on said first thin silicon oxide film, wherein said first photoresist pattern is formed on said polysilicon film in said first region of said principal surface, and said polysilicon film is selectively removed by using said first photoresist pattern as a mask, wherein said first named well is formed by ion-implanting a first impurity into said second and third regions of said principal surface by using said first photoresist pattern as a mask, wherein after said first photoresist pattern is removed, said second photoresist pattern is formed on said first thin silicon oxide film in said second region of said principal surface, wherein said first thin silicon oxide film and said first insulating material in said third region of said principal surface are selectively removed by using as a mask the remaining polysilicon film and said second photoresist pattern, wherein the remaining polysilicon film and said singly crystalline silicon substrate in said third region are selectively etched by using said second photoresist pattern as a mask, wherein a second well is formed by ion-implanting a second impurity into said first and third regions of said principal surface by using said second photoresist pattern as a mask, wherein said first named trench is formed by selectively etching said third region of said principal surface by using the remaining first thin silicon oxide film and said second photoresist pattern as a mask, so that said first named trench has a depth larger than that of said second trenches, and wherein after said second photoresist pattern is removed, a second insulating material is filled into said first named trench.

7. A method claimed in claim 4, wherein said first named trench is filled up with said second insulating material by depositing a silicon oxide film on an inner wall surface of said first named trench, and depositing a silicon nitride firm on said principal surface of said single crystalline silicon substrate, and filling up said first named trench with said second insulating material.

8. A method claimed in claim 7, wherein after said first named trench is filled up with said second insulating material, said second insulating material is polished by a chemical mechanical polishing process until a surface is planarized.

9. A method claimed in claim 5, wherein said first named trench is filled up with said second insulating material by depositing a silicon oxide film on an inner wall surface of said first named trench, and depositing a silicon nitride firm on said principal surface of said single crystalline silicon substrate, and filling up said first named trench with said second insulating material.

10. A method claimed in claim 9, wherein after said first named trench is filled up with said second insulating material, said second insulating material is polished by a chemical mechanical polishing process until a surface is planarized.

11. A method claimed in claim 6, wherein said first named trench is filled up with said second insulating material by depositing a silicon oxide film on an inner wall surface of said first named trench, and depositing a silicon nitride firm on said principal surface of said single crystalline silicon substrate, and filling up said first named trench with said second insulating material.

12. A method claimed in claim 11, wherein after said first named trench is filled up with said second insulating material, said second insulating material is polished by a chemical mechanical polishing process until a surface is planarized.

13. A method for manufacturing a semiconductor device, including the steps of forming a first insulating film on a semiconductor substrate, patterned by using a first photoresist pattern used for forming a first well, forming a second insulating film on said semiconductor substrate, patterned by using a second photoresist pattern used for forming a second well near to said first well, and forming a trench in said semiconductor substrate by using said first and second insulating films as a mask, wherein an underlying insulating film is formed to cover a first region, a second region, and a third region between said first and second regions, of a principal surface of said semiconductor substrate, said first region corresponding to said first well, said second region corresponding to said second well, and said third region corresponding to a region in which said trench is to be formed, wherein said first insulating film is formed by forming said first photoresist pattern on said underlying insulating film to cover said second and third regions of said principal surface of said semiconductor substrate, and forming an insulating film on only said underlying insulating film uncovered with said first photoresist pattern, and said second insulating film is formed by selectively removing said first photoresist pattern so that said first photoresist pattern remains only on said third region, selectively forming said second photoresist pattern on said first insulating film formed on said first region, and forming said second insulating film by using as a mask said first photoresist pattern remaining only on said third region and said second photoresist pattern formed on said first insulating film formed on said first region, and wherein said trench is formed by removing said first and second photoresist patterns and etching said underlying insulating film and said semiconductor substrate by using said first and second insulating films as a mask so that said trench is formed in said third region of said principal surface of said semiconductor substrate.

14. A method claimed in claim 13,
wherein said semiconductor substrate is formed of a single crystalline silicon substrate and a second trench is formed on a principal surface of said single crystalline silicon substrate at a region including a portion corresponding to said region, and said second trench is filled with a first insulating material, wherein a first thin silicon oxide film is deposited on said first insulating material filling up said second trench and said principal surface of said single crystalline silicon substrate, wherein said first photoresist pattern is formed on said first thin insulating film in said first and third regions of said principal surface, wherein a first well is formed by ion-implanting a first impurity into said second region of said principal surface of said single crystalline silicon substrate by using said first photoresist pattern as a mask, wherein a third silicon oxide film is selectively formed on said first thin silicon oxide film in said second region of said principal surface by using said first photoresist pattern as a mask, wherein said first photoresist pattern on said first thin silicon oxide film in said first region of said principal surface is selectively removed so that said first photoresist pattern remains on said third region of said principal surface, and said second photoresist pattern is formed on said third silicon oxide film in said second region of said principal surface, wherein a second well is formed by ion-implanting a second impurity into said first region of said principal surface of said single crystalline silicon substrate by using the remaining first photoresist pattern and said second photoresist pattern as a mask, wherein a fourth silicon oxide film is selectively formed on said first thin silicon oxide film in said first region of said principal surface by using the remaining first photoresist pattern and said second photoresist pattern as a mask, and wherein the remaining first photoresist pattern and said second photoresist pattern are removed, and said first named trench is formed by selectively etching said third region of said principal surface of said single crystalline silicon substrate by using said third and fourth silicon oxide films as a mask, so that said first named trench has a depth larger than that of said second trenches, and a second insulating material is filled into said first named trench.

15. A method claimed in claim 14, wherein said first named trench is filled up with said second insulating material by depositing a silicon oxide film on an inner wall surface of said first named trench, and depositing a silicon nitride firm on said principal surface of said single crystalline silicon substrate, and filling up said first named trench with said second insulating material.

16. A method claimed in claim 15, wherein after said first named trench is filled up with said second insulating material, said second insulating material is polished by a chemical mechanical polishing process until a surface is planarized.

17. A method of forming a trench in a semiconductor substrate, comprising the steps of:

providing an insulating film on the substrate;
providing a first photoresist pattern on the insulating film;
forming a well in the substrate using the first photoresist pattern as a mask;

patterning the insulating film using the first photoresist pattern as a mask;

providing a second photoresist pattern on the substrate, the second photoresist pattern being spaced from the patterned insulating film on the substrate by a first distance; and forming a trench in the substrate using as separate masks the patterned insulating film and the second photoresist pattern, the first distance defining a width of the trench.

18. A method of forming a trench in a semiconductor substrate, comprising the steps of:

forming a pair of spaced apart first trenches in a principal surface of a single crystalline substrate;

filling the first trenches and coating the principal surface with a first insulating material;

providing a thin silicon oxide insulating film on the first insulating material on first, second and third regions of the substrate, the third region being between the first and second regions and all three regions being between the first trenches;

providing a first photoresist pattern on the silicon oxide insulating film in the first region;

forming a first well in the substrate using the first photoresist pattern as a mask by ion-implanting a first impurity into the second and third regions;

selectively removing the silicon oxide insulating film using the first photoresist pattern as a mask so that the silicon oxide insulating film is on only the first region;

removing the first photoresist pattern;

providing a second photoresist pattern on the second region, the second photoresist pattern being spaced from the silicon oxide insulating film on the substrate;

forming a second well in the substrate using the second photoresist pattern as a mask by ion-implanting a second impurity into the first and third regions;

forming a second trench in the third region of the principal surface of the substrate using as separate masks the silicon oxide insulating film and the second photoresist pattern;

removing the second photoresist; and filling the second trench with a second insulating material.

* * * * *